United States Patent

Persson et al.

Patent Number: 6,138,347
Date of Patent: Oct. 31, 2000

[54] METHOD AND APPARATUS FOR THE SUPPRESSION OF ELECTROMAGNETIC INTERFERENCE IN AN ELECTRONIC SYSTEM

[75] Inventors: Për-Häkan Persson, Research Triangle Park; Nils Rutger Rydbeck, Cary, both of N.C.

[73] Assignee: Ericsson GE Mobile Communications Inc., Research Triangle Park, N.C.

[21] Appl. No.: 08/967,913

[22] Filed: Nov. 12, 1997

Related U.S. Application Data

[62] Division of application No. 08/731,771, Oct. 18, 1996, Pat. No. 5,920,984, which is a division of application No. 08/165,967, Dec. 10, 1993, abandoned.

[51] Int. Cl.[7] .................................................. H05K 3/30
[52] U.S. Cl. ............................. 29/836; 29/842; 29/835; 29/832; 29/593; 174/35 R; 361/818
[58] Field of Search ........................... 29/836, 593, 832, 29/834, 838, 842, 846; 174/35 R; 324/95, 520; 361/818, 816

[56] References Cited

U.S. PATENT DOCUMENTS

| | | | |
|---|---|---|---|
| 3,240,864 | 3/1966 | Kahl | 174/52 |
| 3,504,095 | 3/1970 | Roberson et al. | 174/35 |
| 3,643,135 | 2/1972 | Devore et al. | 317/101 D |
| 4,572,921 | 2/1986 | May et al. | 174/35 |
| 4,619,043 | 10/1986 | Takahashi et al. | 29/840 |
| 4,754,101 | 6/1988 | Stickney et al. | 174/35 |
| 4,823,235 | 4/1989 | Suzuki et al. | 361/424 |
| 4,864,076 | 9/1989 | Stickney | 174/35 |
| 4,872,090 | 10/1989 | Taylor et al. | 361/464 |
| 4,879,434 | 11/1989 | Assel et al. | 174/35 |
| 4,890,199 | 12/1989 | Beutler | 361/424 |
| 4,914,808 | 4/1990 | Okumura et al. | 29/740 |
| 5,029,254 | 7/1991 | Stickney | 174/35 |
| 5,099,396 | 3/1992 | Barz et al. | 361/424 |
| 5,124,889 | 6/1992 | Humbert et al. | 361/424 |
| 5,150,282 | 9/1992 | Tomura et al. | 361/424 |
| 5,151,774 | 9/1992 | Mori et al. | 357/79 |
| 5,233,507 | 8/1993 | Gunther | 361/818 |
| 5,343,361 | 8/1994 | Rudy et al. | 361/710 |
| 5,353,201 | 10/1994 | Maeda | 361/816 |
| 5,357,404 | 10/1994 | Bright et al. | 361/818 |
| 5,383,098 | 1/1995 | Ma et al. | 361/818 |
| 5,428,508 | 6/1995 | Pronto | 361/818 |
| 5,596,487 | 1/1997 | Castaneda et al. | 361/814 |
| 5,764,492 | 6/1998 | Ady et al. | 361/818 |
| 5,777,856 | 7/1998 | Phillips et al. | 361/816 |
| 5,803,246 | 9/1998 | Kitamura et al. | 206/204 |
| 5,838,551 | 11/1998 | Chan | 361/818 |
| 5,864,088 | 1/1999 | Sato et al. | 174/35 MS |
| 5,873,691 | 2/1999 | Asai et al. | 414/416 |
| 5,880,403 | 3/1999 | Czajkowski et al. | 174/35 R |
| 5,917,708 | 6/1999 | Moran et al. | 361/800 |
| 5,920,539 | 7/1999 | Schell et al. | 369/244 |
| 5,946,199 | 8/1999 | Matsuzaki | 361/818 |

*Primary Examiner*—Lee Young
*Assistant Examiner*—Minh Trinh
*Attorney, Agent, or Firm*—Myers Bigel Sibley & Sajovec

[57] ABSTRACT

A conductive strap configured to attach to a circuit board containing a component sensitive to electronmagnetic interference (EMI) and to slidably contact an enclosure having a conductive internal surface can reduce or eliminate EMI in an electronic device. The strap is positioned on the circuit board to shield the sensitive component from EMI. Slidable contact between the shielding strap and the enclosure internal surface renders the strap suitable for almost any enclosure configuration without any design modification.

24 Claims, 5 Drawing Sheets

METHOD AND APPARATUS FOR THE SUPPRESSION OF ELECTROMAGNETIC INTERFERENCE IN AN ELECTRONIC SYSTEM

This application is a division of application Ser. No. 08/731,771, filed Oct. 18, 1996 and issued as U.S. Pat. No. 5,920,984 on Jul. 13, 1999, which is a divisional application of application Ser. No. 08/165,967, filed Dec. 10, 1993, now abandoned.

FIELD OF THE INVENTION

The present invention relates generally to electronic systems and more particularly to packaging of electronic systems which are subject to electronic interference.

BACKGROUND OF THE INVENTION

Electromagnetic interference, or EMI, is a common problem that influences the design of many electrical circuits. EMI results from the undesired interaction and coupling of electric and magnetic fields generated by sources within or external to an electrical circuit. Devices susceptible to EMI suffer in performance. Thus such interference should be minimized.

EMI can be particularly severe when a radio circuit is housed within a small, confined enclosure, such as a cellular or other radiotelephone, and thus unavoidably is positioned adjacent other electronic circuits. The proximity of the radio circuit to other circuit types generally increases both the likelihood of the circuit being subjected to EMI and the intensity of EMI received by the circuit. The combination of radio frequency (RF) circuits with high speed digital circuits further increases the likelihood of EMI between the circuits, as the spurious high frequency signal components associated with the high-rise-time transient signals generated by microprocessors and digital signal processors being clocked at MHz rates can easily couple to RF circuits.

EMI may arise from either a defect in circuit or packaging design. Improperly designed circuits, such as those in which the potential coupling of adjacent circuits has not been considered and addressed, may allow spurious signals to "leak in" through power supply lines. Injudicious decisions made during circuit layout which result in poor grounding and poor component placement can also produce EMI.

As noted above, packaging can also greatly influence the degree to which EMI affects the performance of a radio circuit. The underlying goal of RF packaging is to provide adequate shielding of internal circuitry from compartmental RF energy leakage and to prevent external energy leakage. In addition, the packaging design should provide rugged, low impedance electrical grounding.

The design of the shielding apparatus is dependent upon the nature of the interference. High impedance electromagnetic waves, which are primarily electric in nature, can be effectively blocked and dissipated by a well grounded conductor. Low impedance electromagnetic waves, which in contrast are primarily magnetic in nature, can be blocked by shields formed from a material with high magnetic permeability, such as steel or mu-metal. The configuration of many RF circuits requires that the designer consider and address either or both low and high impedance-based EMI.

Shielding devices have been disclosed in a variety of configurations for solving a specific shielding problem at hand. U.S. Pat. No. 4,572,921 issued Feb. 25, 1986, to May et al. relates to a shielding device intended for application on doors and hatches of enclosures of the type often included on an anechoic chamber. The shield comprises an elongate conductive strip having a set of fingers that extend transversely from, then overlie the strip. The shield is received within a door channel in the portion of the enclosure surrounding the doorway and is fastened thereto using screws or rivets, or a conductive adhesive. The closed door contacts the fingers, thus providing a shield surrounding the door to a housing. See also U.S. Pat. No. 3,504,095 issued Mar. 31, 1970, to Robertson et al. Another configuration for shielding a door to a housing is disclosed in U.S. Pat. No. 4,864,076 issued Sep. 5, 1989, to Stickney, which illustrates a thin walled metal strip covering a portion of a sealing gasket.

U.S. Pat. No. 4,754,101 issued Jun. 28, 1988, to Stickney et al. relates to a shielding housing for enclosing a specific device or set of devices mounted on a conventional printed circuit board. The shield is a box formed from strips of metal having a plurality of downwardly-extending fingers and mounting prongs. The strips are fastened to a printed circuit board by soldering the mounting prongs into vias located on the circuit board, with the result that the housing covers the components the designer has assumed may require shielding.

Although the aforementioned solutions can be effective for specific applications requiring EMI shielding, each addresses a specific application and fails to address the problems raised by the unpredictability of EMI for a broad-based array of applications. An experienced designer can take measures to shield those devices which are known either to be EMI emitters or to be susceptible to emissions. Nonetheless, electromagnetic field interactions are sufficiently complex that unexpected stray currents or electrostatic fields may be and often are present. Generally such unpredicted (and unpredictable) EMI requires additional shielding components to be added manually to the system after it has been designed and tested. For example, in cellular radiotelephones, shielding elements such as copper tape and hand soldered grounding strips are commonly used—even on circuit boards manufactured entirely using modern automated equipment.

Manual EMI-addressing operations may contribute significantly to the cost and quality of manufacture. In some cases, a custom shield can be integrated into the manufacturing process, but this takes time and does not often provide a permanent solution. Varying manufacturing tolerances over different lots will often change the nature and source of EMI throughout the product lifetime, which then requires readjustment of the locations of the later-added shielding elements. As a result, a more flexible approach to solving EMI problems that can provide shielding for a broad range of applications and that can be integrated into existing automated manufacturing processes with little or no redesign of circuit boards is needed.

SUMMARY OF THE INVENTION

In view of the foregoing, it is an object of the present invention to provide a method and apparatus for shielding RF circuits which can be integrated into the manufacture of an electronic system.

It is also an object of the present invention to provide a shielding apparatus and method that can be employed with a wide variety of different electronic device configurations.

It is an additional object of the present invention to provide a shielding apparatus and method that can implemented into the design of an electronic device after testing for EMI with minimal redesign of the circuit board.

It is a further object of the present invention to provide a method and apparatus by which EMI attributed to variances between different lots of components can be eliminated with a minimum of impact on an automated manufacturing process.

These and other objects are satisfied by the present invention, which provides a conductive shielding strap configured to attach to a circuit board containing a component sensitive to EMI and to slidably contact an enclosure having a conductive internal surface. The strap is positioned on the circuit board to shield the sensitive component from EMI. Slidable contact between the shielding strap and the enclosure internal surface renders the strap suitable for almost any enclosure configuration without any design modification.

The usefulness of the strap in addressing manufacturing difficulties arising from EMI is demonstrated in a preferred embodiment of the invention, in which the circuit board includes a plurality of grounding sites on its peripheral portion, each of which is configured to receive a shielding strap. After testing of the circuit board components for EMI, shielding straps can be mounted to the grounding sites determined to be best positioned to provide EMI shielding to the electronic components of the circuit board. Thus EMI problems arising unexpectedly and discovered only after testing of the device can be quickly addressed without design changes to the board or device, and can be so addressed in a manner that lends itself to automation.

It is also preferred that the grounding sites are positioned and the shielding strap is configured so that, after the circuit board-strap package is housed within an enclosure, the strap is elastically deflected by the conductive internal surface of the enclosure as the surface slides relative to the strap. Elastic deflection of the strap causes the portion thereof contacting the enclosure internal surface, which is preferably an arcuate portion protruding from the strap to face the internal surface, to exert a positive pressure thereon that improves electrical contact between the strap and the enclosure. In addition, deflection of the strap by the enclosure facilitates assembly of the enclosure.

DETAILED DESCRIPTION OF THE INVENTION

Figure 1A:
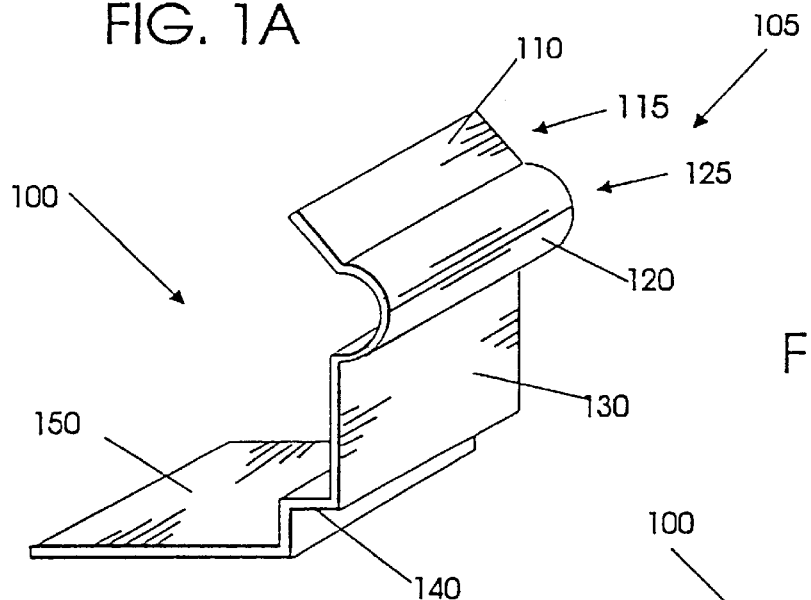
FIG. 1A is a perspective view of an embodiment of a shielding strap of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in this art.

Referring now to FIGS. 1A–1D, perspective, side, front, and top views of a conductive shielding strap 100 of the present invention are shown. The shielding strap 100 comprises a generally horizontal mounting portion 150, a relief notch 140, and a generally upright member 105 comprising a support arm 130, an arcuate contact portion 120, and a tail portion 110. As the shielding strap 100 is illustratively and preferably formed from a single piece elongated strip of a conductive metal, the aforementioned structures comprising the shielding strap 100 serially merge end-to-end with one another.

Figure 1B:
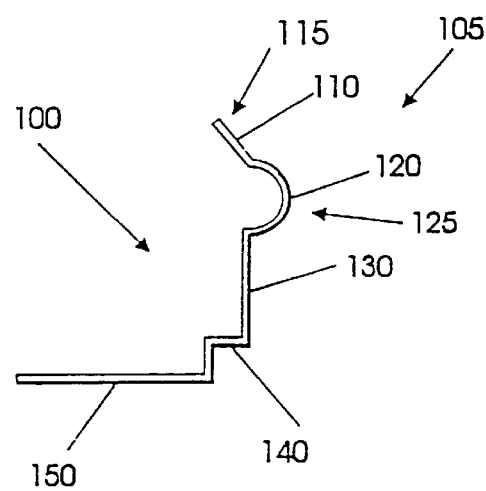
FIG. 1B is side elevation view of the shielding strap of FIG. 1A.

As best seen in FIGS. 1A and 1B, the strap mounting portion 150 is disposed generally horizontally and is generally planar for convenient, rapid, and preferably automated attachment and electrical connection to a grounding pad of an underlying circuit board. Those skilled in this art will appreciate that, although the illustrated planar configuration is preferred, other configurations of the mounting portion 150 adapted for attachment and electrical connection to an underlying circuit board are suitable for use with this invention. The particular configurations suitable for use with any specific circuit board will depend on the configuration of the circuit board itself. Exemplary mounting portion configuration alternatives include prongs extending from the shielding strap 100 configured to be received in grounded vias in the circuit board and apertures in the shielding strap 100 adapted to receive grounded pins extending from the circuit board.

Still referring to FIGS. 1A and 1B, the relief notch 140 is an inverted L-shaped structure. The vertical arm of the "L" is fixed substantially perpendicularly to one end of the mounting portion 150 and extends upwardly therefrom, and the horizontal arm of the "L" is fixed to the lower end of the support arm 130 and extends away from the mounting portion 150. The relief notch 140 is included in the shielding strap 100 to facilitate deflection of the structures of the upright member 105 of the shielding strap 100 (namely the support arm 130, the arcuate contact portion 120, and the tail portion 110) relative to the mounting portion 150 from an undeflected position to a deflected position in which the contact portion 120 exerts a positive pressure on a surface enclosing the underlying circuit board.

The ability of the upright member 105 to elastically deflect in response to the imposition of such a deflection by contact with the conductive surface of an enclosure is particularly desirable for the present invention. In particular, when the upright member 105 is in a deflected position, the arcuate contact portion 120 exerts a positive contact pressure on the surface imposing the deflection, thereby ensuring electrical contact therebetween. Also, the ability of the upright arm 105 to deflect elastically substantially increases the number of acceptable contact points between the contact surface 120 and the enclosure surface in which the shielding strap 100 is not permanently deflected or otherwise damaged. As a result, a strap of a specific size is suitable for a number of different enclosure configurations. Those skilled in this art will appreciate that, although the illustrated L-shaped configuration for the relief notch 140 is preferred, there are many linear, curvilinear, and angled configurations for the expanse of the shielding strap 100 between the mounting portion 150 and the upright arm 105 that can serve an elastic spring responsive to deflection by an enclosure surface and thus be suitable for use with the present invention. It will also be understood that the present invention encompasses shielding straps in which a relief notch or other spring portion bridging the mounting portion 150 and the contact portion 120 is omitted entirely.

The upright member 105 of the shielding strap 100, shown most clearly in FIGS. 1A and 1B, is disposed generally upright in a plane generally normal to the longitudinal axis of the mounting portion 150. The upright member 105 comprises the support arm 130, the arcuate contact portion 120, and the tail portion 110. The support arm 130 is fixed at its lower end substantially perpendicularly to the horizontal arm of the relief notch 140 and extends upwardly therefrom. Illustratively and preferably, the arcuate portion 120 is attached to the upper end of the support arm 130 and protrudes away from the mounting portion 150. The arcuate portion 120 is configured so that its contact surface 125 (shown best in FIG. 1B) faces and slidably contacts the enclosure conductive surface.

The arcuate configuration enables the contact surface 125 to establish and maintain adequate slidable contact with an enclosure surface disposed in a wide variety of positions and angular orientations. Although inclusion of the illustrated arcuate portion 120 is preferred, those skilled in this art will appreciate that any configuration for the contact portion 120 that can maintain slidable contact with an enclosure while mounted to an underlying circuit board is suitable for use with the present invention.

Figure 1C:
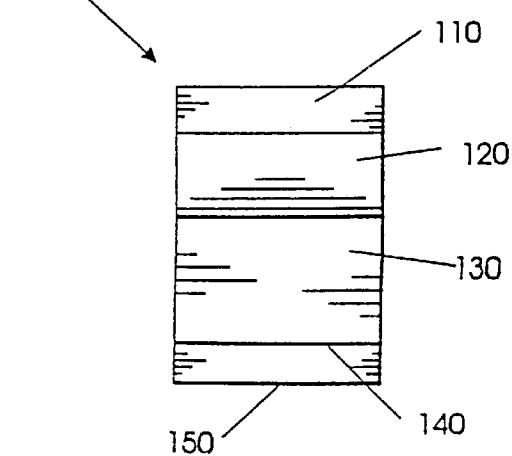
FIG. 1C is a front elevation view of the shielding strap of FIGS. 1A and 1B.
Figure 1D:
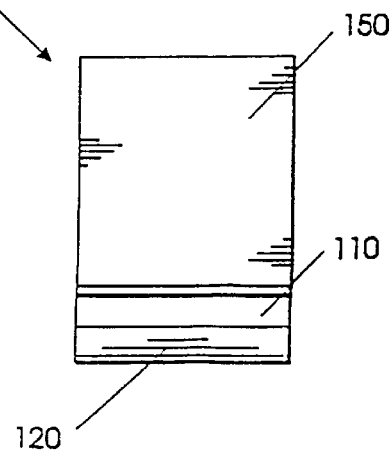
FIG. 1D is a top view of the shielding strap of FIGS. 1A–1C.

As seen in FIGS. 1A, 1B and 1C, the tail portion 110 is attached to the upper end of the arcuate contact portion 120 and extends upwardly and obliquely away therefrom. The tail portion 110 is optionally but preferably included in the shielding strap 100 to facilitate assembly by forcing the conductive surface of an enclosure to contact the arcuate portion contact surface 120 of the shielding strap 100. As such an enclosure travels toward its final position during assembly, it may become misaligned so that its lower edge contacts the upper surface 115 of the tail portion 110 rather than the arcuate contact portion 120. In that event, the illustrated and preferred configuration encourages the lower edge of the enclosure to slide downwardly along the upper surface of the tail portion 110 toward and eventually into adjacent contacting relation with the contact surface 125. Moreover, contact between the enclosure edge and the tail portion 110 deflects all of the structures of the upright member 105, including the contact portion 120, toward the mounting portion 150. This deflection further facilitates the travel of the enclosure surface to its final assembled position.

The shielding strap 100 may be formed from an electrically insulating material that has a conductive portion, such as a conductive coating, between the contact portion 120 and the mounting portion 150. Alternatively, the shielding strap 100 may be formed entirely of a conductive material. Exemplary materials include conductive metals, such as beryllium copper, and high permeability metals, such as cold rolled steel, mu-metal, and Carpenter™ steel, which can provide desirable magnetic properties for low impedance EMI. Typically, the shielding strap 100 is between about 0.003 and 0.007 inches thick and 0.010 and 0.030 wide, but these dimensions can be varied considerably for different applications. The shielding strap 100 may be heat treated to provide resiliency and resistance to plastic deformation, and further may be plated to aid in solderability and resistance to corrosion.

Figure 2:
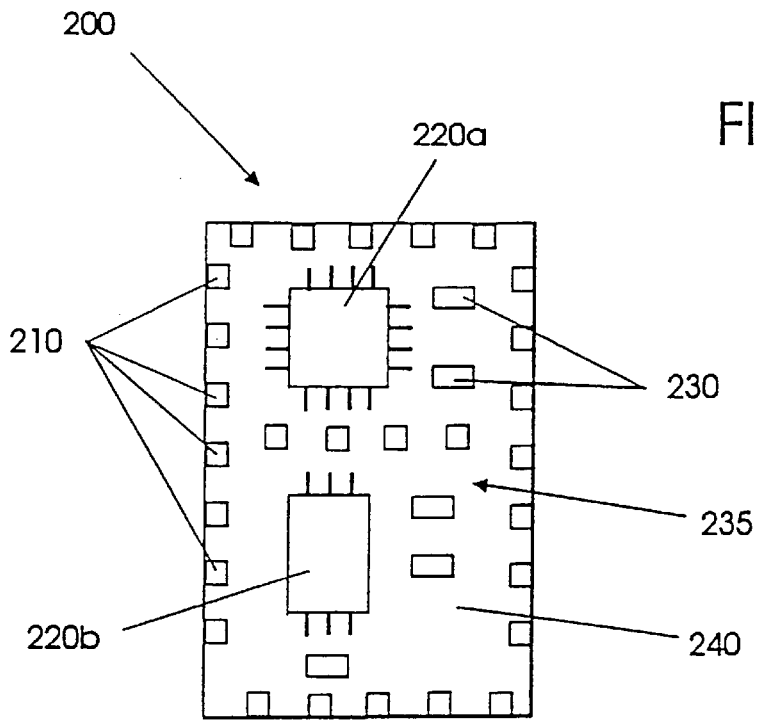
FIG. 2 is a top view of a surface mount printed circuit board having grounding sites positioned thereon.

The preferred use of the shielding strap 100 to shield a component from EMI is demonstrated in FIG. 2, which illustrates an exemplary surface mounted electronic package 200, such as would be included in a radiotelephone. Surface mounting is a manufacturing technique in which electronic components and leads connecting these components are mounted on pads on the upper mounting surface of a circuit board. As is well known to those skilled in this art, this technique is particularly suitable for automated manufacture. Although a surface-mounted board is illustrated and preferred, those skilled in this art will recognize that the present invention is suitable for any type of circuit board or mounting substrate that includes devices sensitive to EMI and that is to be housed within an enclosure having a conductive internal surface.

Referring still to FIG. 2, exemplary packaged integrated circuits (ICs) 220a, 220b are mounted on the mounting surface 235 of an underlying circuit board 240. The ICs 220a, 220b can be virtually any type of circuit, such as RF modulators, RF synthesizers, digital signal processors (DSPs), and the like. In addition to the ICs, a typical surface mounted circuit board will include other surface mounted components, such as discrete resistors, capacitors, and inductors. These components are illustrated broadly in FIG. 2 at 230.

Continuing to refer to FIG. 2, the electronic package 200 also includes a plurality of grounding pads 210 positioned on the mounting surface 235 of the substrate board 240. The grounding pads 210 are electrically connected to ground planes on the surface or within an underlying layer of the circuit board 240 and are configured to receive and electrically connect with the mounting portion 150 of a shielding strap 100 (not shown in FIG. 2). Those skilled in this art will appreciate that the present invention encompasses other grounding site configurations, such as pins extending from a pad or a via within a pad configured to receive a pin or prong, which will enable the electrical grounding of a shielding strap 100 of the present invention. The grounding pads 210 are preferably and illustratively positioned around the peripheral portion 245 of the circuit board 240, as the conductive surface of an enclosure to be contacted by a shielding strap 100 will generally reside on or adjacent the board's periphery. In addition, in the illustrated embodiment, some grounding pads 210 are positioned adjacent the ICs 220a, 220b in the event these ICs prove to be sufficiently sensitive to EMI to warrant shielding by the present invention.

Figure 3:
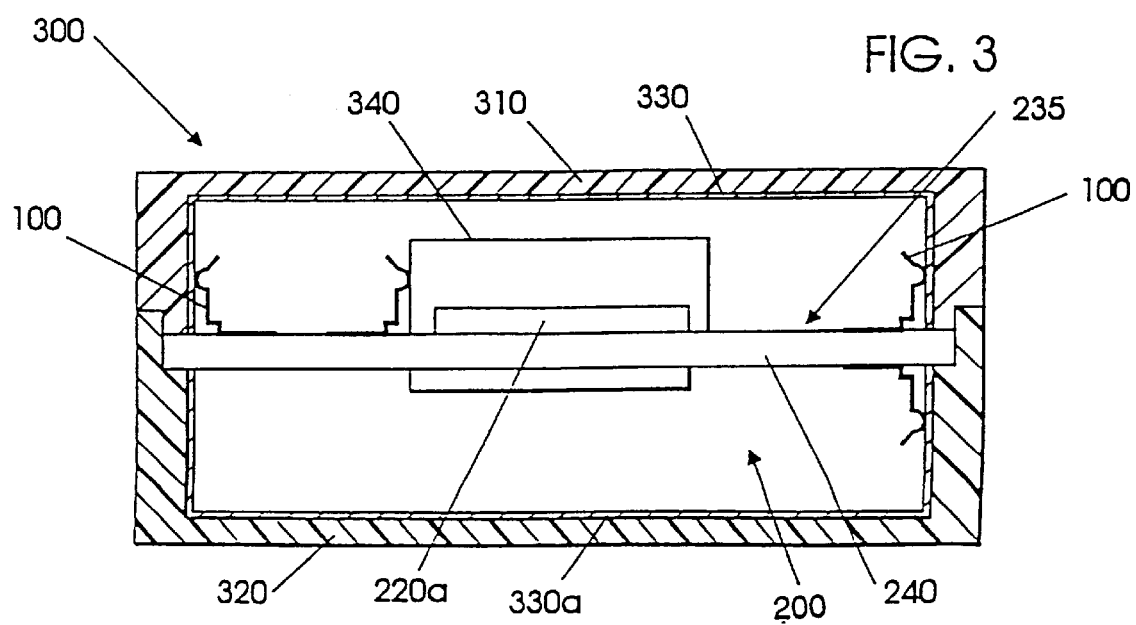
FIG. 3 is a cross-sectional view of a printed circuit board contained within a radiotelephone enclosure.

FIG. 3 cross-sectionally illustrates the assembled electronic package 200 of FIG. 2 mounted between a housing receptacle 310 and a mating housing cover 320 of an electronic system 300, such as a radiotelephone. Each of the receptacle 310 and the housing 320 has a conductive internal surface 330, 330a. The receptacle 310 and cover 320 are typically formed from a polymeric material such as polystyrene, acrylonitrile-butadiene-styrene terpolymer (ABS), polycarbonate, and the like. If a polymeric material is indeed employed in the receptacle 310 and the cover 320, the internal surfaces 330, 330a of these components are plated with a layer of a conductive material, such as nickel or aluminum. Often mating housing components include interlocking fingers (not shown), which provide electrical contact therebetween after assembly; also, grounded contact between the housing components and the circuit board 240 may be provided through an interference fit joint or a conductive gasket as exemplified by Stickney, supra.

As shown in FIG. 3, assembly of the cover 320 atop its mating receptacle 310 causes the internal surface 330 of the cover 320 to slidably contact each of the contact surfaces 125 of the strap arcuate portions 120 attached to the circuit board 240. It is preferred that grounding pads 210 be positioned on the substrate board 200 and the straps 100 be mounted thereon so that as the cover 320 is lowered onto the receptacle 310, the internal surface 330 of the cover 320 elastically deflects the upright arm 105 inwardly, i.e., toward the mounting portion 150. As described hereinabove, such deflection results in the arcuate portion contact surface 125 exerting a positive pressure on the cover internal surface 330, which pressure improves the electrical contact therebetween.

It can be envisioned from FIG. 3 that a slight misalignment of the cover 320 with the receptacle 310 during assembly does not affect the ultimate positional relationship between the arcuate portion 120 and the internal surface 330. The relationship is not affected because contact between the lower edge of the receptacle 310 and a strap tail portion 110 deflects each upper arm 105 inwardly and encourages the internal surface 330 to slide downwardly along the tail portion 110 to its proper assembled position in adjacent contacting relation with the strap contact surface 125. It can also be seen from FIG. 3 that the illustrated shielding strap 100 is particularly useful for enclosures in which the conductive surface defines a plane that is substantially orthogonal to the plane defined by the mounting surface 235 of the circuit board 240 (i.e., the plane defined by the enclosure conductive surface is normal to the longitudinal axis of the strap mounting portion 150), but can be used with enclosures that define non-orthogonal planes also.

The inclusion of shielding straps 100 of the present invention within an enclosure does not preclude the use of existing shielding techniques. Rather, the shielding straps 100 can be used in conjunction with other known grounding techniques. FIG. 3 shows the exemplary use of a shielding strap 100 in conjunction with an existing EMI shielding enclosure 340 for the shielding of an electronic component contained therein. The addition of the shielding strap 100 can augment the effectiveness of the shield 340 in situations where the shield 340 is, by itself, inadequate. FIG. 3 also illustrates that a strap 100 may be included not only on the upper mounting surface 235 of the circuit board 240, but also on its underside, with the strap 100 contacting the conductive surface 330a of the receptacle if so positioning the strap 100 can reduce or eliminate EMI.

Those skilled in this art will appreciate that, although the shielding strap 100 is illustrated herein and is preferred, shielding units of the present invention may take any number of configurations that will reduce the EMI experienced by components on a circuit board. The shielding unit should be configured so that can be attached to any of the plurality of grounding sites provided on the circuit board.

Figure 4:
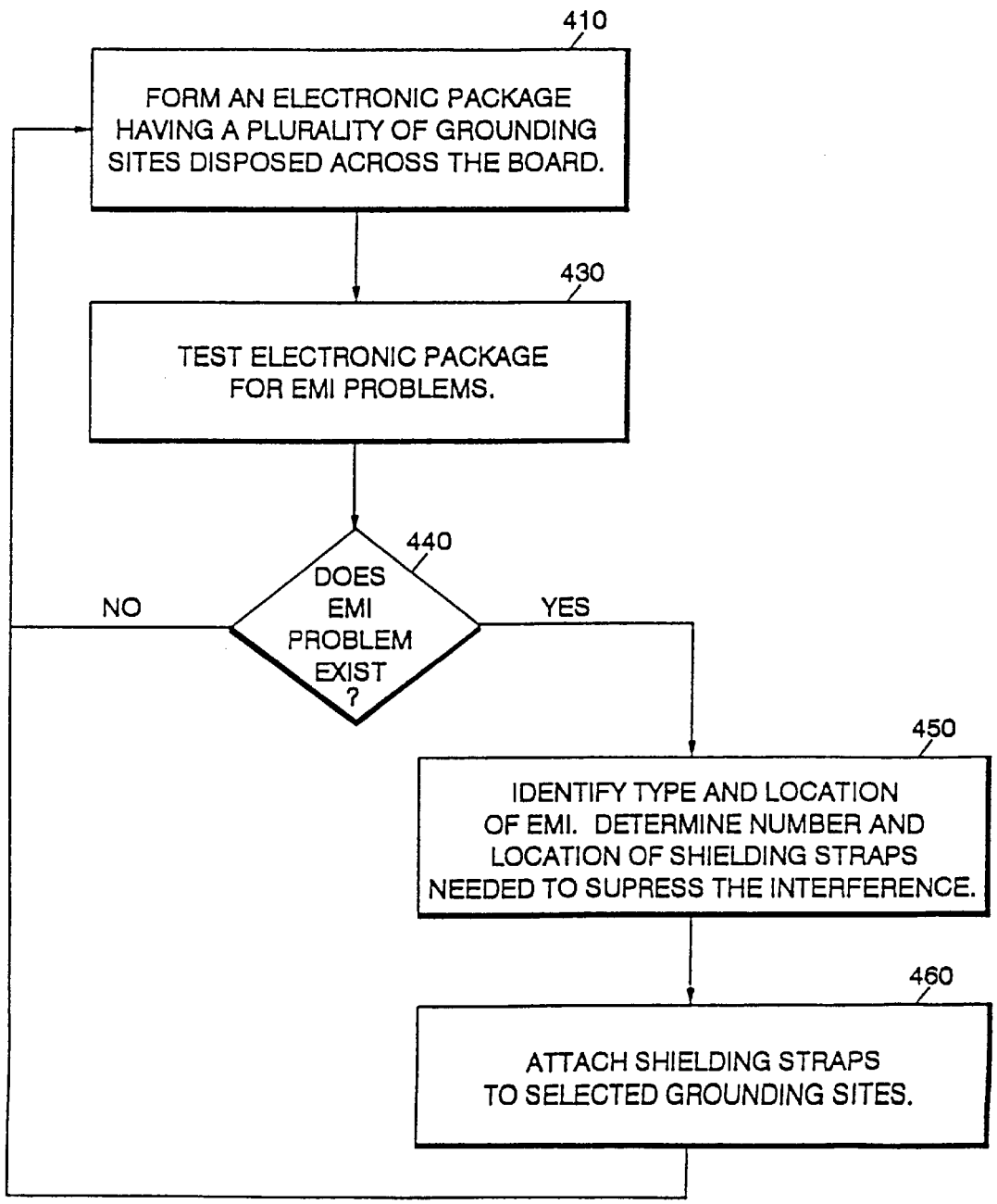
FIG. 4 is a flow chart illustrating operations for discovering and eliminating EMI in an electronic system.

FIG. 4 shows a flow chart illustrating a method for effectively employing a shielding unit of the present invention (for example, shielding strap 100) in EMI shielding. Initially, as illustrated in FIG. 2 and discussed hereinabove, an electronic package 200 is formed that includes a plurality of grounding pads 210 (or other grounding site configuration), preferably on the peripheral portion 245 of the circuit board 240 and adjacent EMI sensitive components (represented by 220a in FIG. 3) on the circuit board 240 (represented in FIG. 4 by block 410). The electronic package 200 is preferably formed using automated surface mount techniques, the precise steps of which are dependent on the proposed function of the electronic package 200 and are not critical to the method of the present invention. It is not anticipated that all of those grounding sites will receive a shielding strap 100, but inclusion of a plurality of grounding pads 210 provides the designer with the ability to shield in one or more precise but unpredicted positions on the circuit board 240.

After formation of the electronic package 200, it is subjected to bench testing to determine if any EMI problems exist (block 430 of FIG. 4). Testing typically involves both emission testing and susceptibility testing, the techniques for which are well known (see, for example, brochure entitled Total RFI/EMI/EMC interference Control Services, published by Instrument Specialties Co., Inc., of Delaware Water Gap, Pa.). If, based on this testing, it is determined that EMI is affecting performance of the device (block 440), the specific problem areas on the electronic package 200 are identified. Using this data, one can empirically determine the number and position of shielding straps 100 required to suppress the EMI (block 450). The device is then replaced inside the housing and retested for EMI. The procedure is repeated until the EMI has been eliminated or reduced to an acceptable level.

Figure 5:
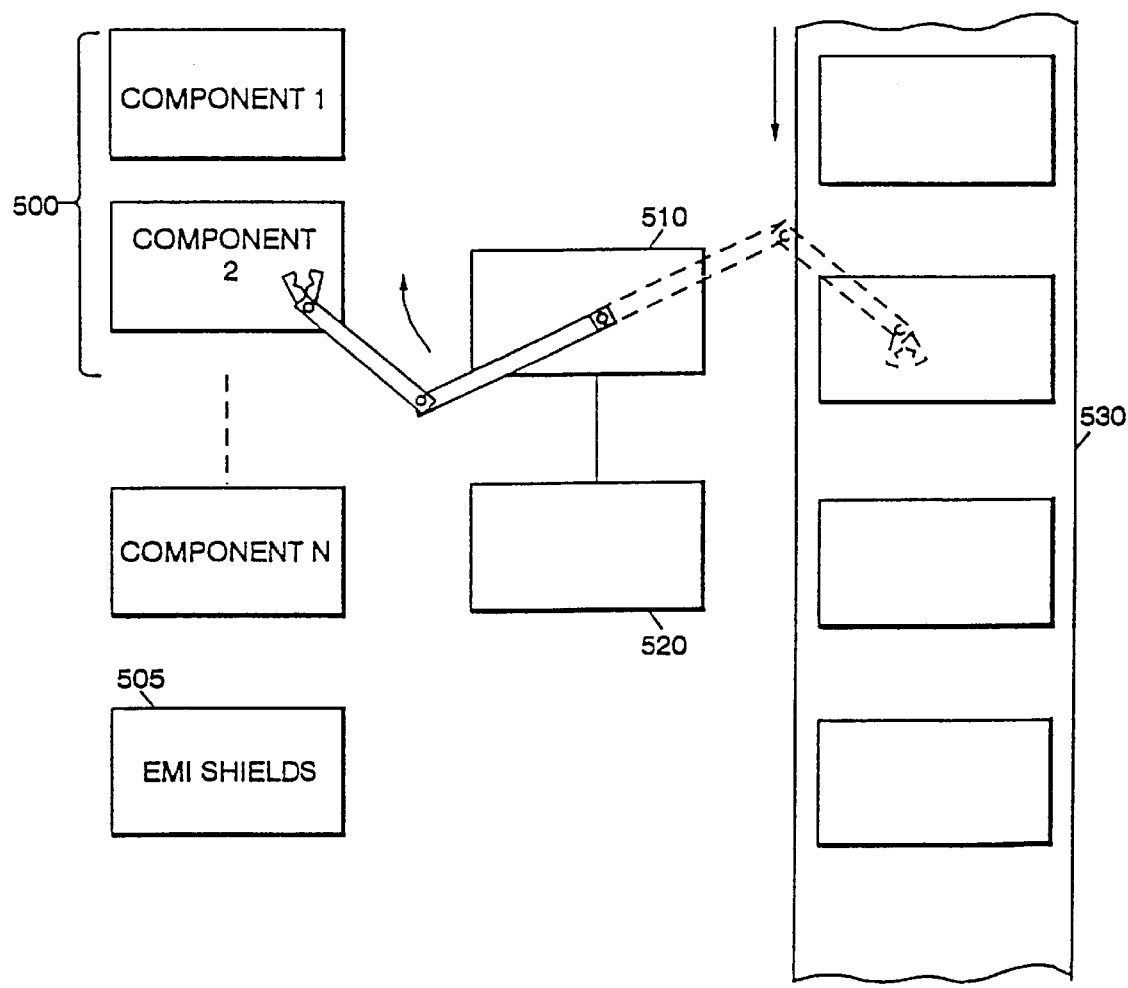
FIG. 5 is a schematic illustration of a manufacturing line in which shielding units can be added to circuit boards during manufacturing.

FIG. 5 schematically illustrates an exemplary manufacturing operation into which EMI testing results of the type illustrated by FIG. 4 can be incorporated. A plurality of tape reels 500, each of which contains electronic components serially and releasably adhered thereto, are positioned adjacent a pick-and place machine 510. The tape reels 500 can contain any electronic component capable of being removed from the tape reel and attached to a circuit board by the pick-and place machine 510. An additional tape reel 505 that contains shielding units of the present invention is also included. Tape reels are the preferred maens for providing components to the pick-and-place machine 510 for their ease of use, but those skilled in this art will recognize that these components may be provided in many other suitable configurations.

The automated pick-and-place machine 510 can be any automated placement unit that those skilled in the art would recognize as suitable for removing components from a temporary storage unit, such as tape reels 500 and 505, and placing them on a circuit board. An exemplary pick-and-place machine is Fuji Model CPII. The operation of the pick-and-place machine 510 is directed by a programmable controller 520, which directs the placement of components and shields. It should be understood by those skilled in this art that, although only a single pick-and-place machine is illustrated herein, as many automated assembly devices as are required for placing components on a circuit board can be employed. It should also be understood that, although automatic placement of components and shields is preferred, manual placement of some or all of the components of the circuit board is also suitable.

A belt conveyor 530 resides adjacent the pick-and place machine 510. The conveyor 530 is configured to convey circuit boards having a plurality of grounding sites past the pick-and-place machine 510 for attachment of the components and shields. Those skilled in this art will appreciate that other conveyor types, such as sliding conveyors, are also suitable for use with the present invention.

Figure 6:
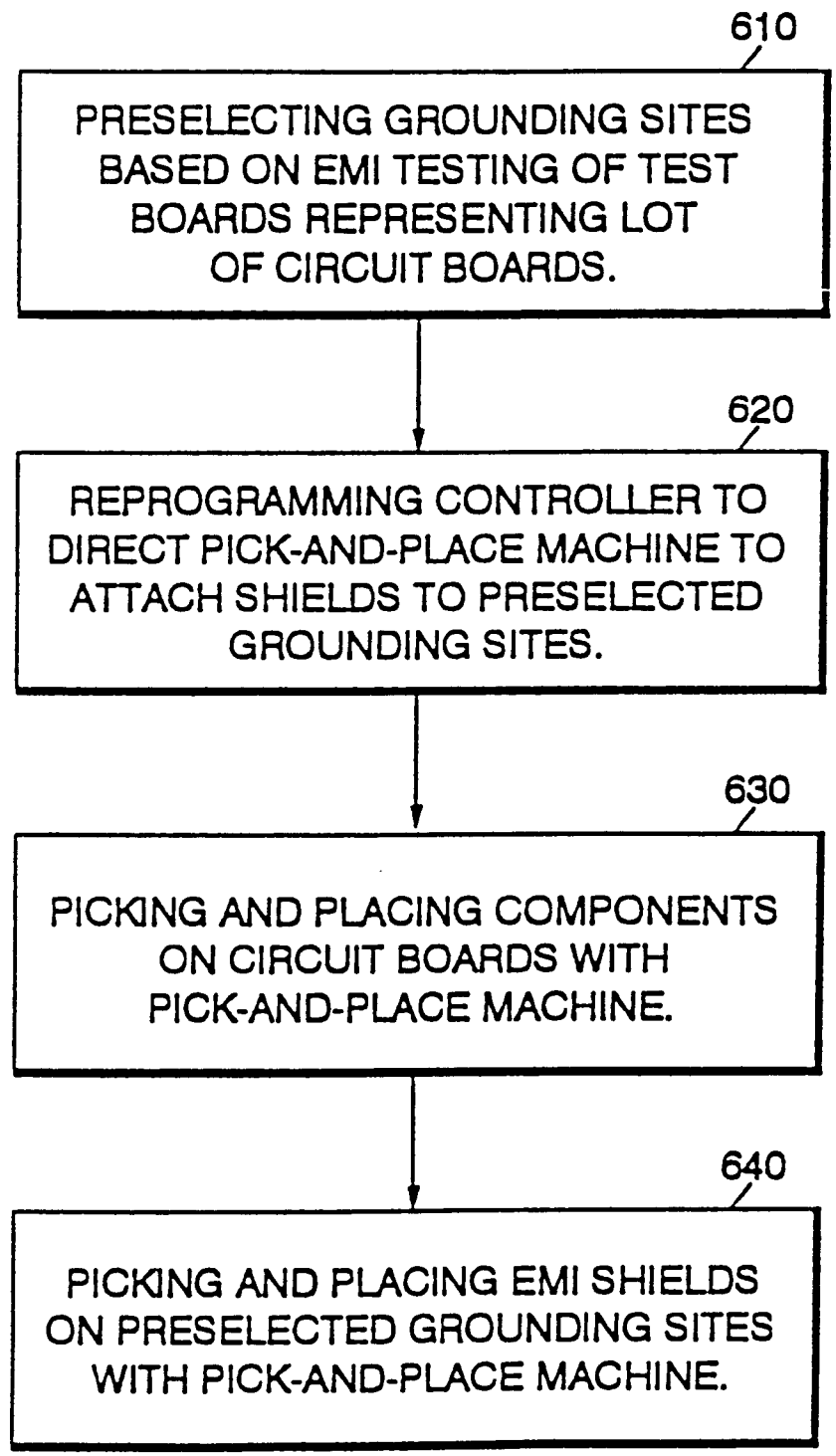
FIG. 6 is a flow chart illustrating operations for producing a plurality of circuit boards shielded from EMI.

Operation of the exemplary manufacturing layout of FIG. 5 is illustrated by the flow chart of FIG. 6. The appropriate placement of one or more shielding units on grounding sites for a particular lot of populated circuit boards is determined by testing as described hereinabove (block 610 of FIG. 6). These preselected grounding sites are programmed into the programmable controller 520 (block 620). As a plurality of circuit boards having a plurality of grounding sites is conveyed along the conveyor 530, electronic components are picked from tape reels 500 and placed on the board by the pick-and-place machine 510 (block 630). In addition, one ore more shielding units are peeled from the tape reel 505 and placed on the preselected grounding sites of the circuit board by the pick-and-place machine 510 (block 640). The placement of the shielding units is directed by the controller 520 based on its programming in block 620.

It should be understood that the sequence of placing electronic components and EMI shielding units is not critical; the shielding units can be placed before, after, or during the placement of the other electronic components. After the lot of circuit boards has been populated, the procedure is repeated on the next lot of circuit boards: the board is tested, grounding sites for shielding units are selected (which may or may not be the same as those indicated by the previous testing), the controller is reprogrammed, and the next lot of boards is manufactured.

The foregoing discussion demonstrates that this method and apparatus enable a designer to add EMI shielding to an electronic package easily and rapidly without significantly prolonging or complicating the manufacturing process. In addition, the number and position of shielding units included in the electronic package can be easily changed to accommodate lot-to-lot differences in the components of the device should this be required.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of manufacturing a plurality of electronic packages comprising the steps of:
   (a) providing a plurality of circuit boards, each of which includes a plurality of grounding sites;
   (b) attaching a device sensitive to electromagnetic interference to one of said plurality of circuit boards;
   (c) attaching at least one electromagnetic shield to a preselected one of said plurality of grounding sites on said circuit board, said grounding site being preselected so that said sensitive device is shielded from electromagnetic interference by attachment of said shield; and
   (d) repeating steps (b) through (c) for a second and subsequent ones of said plurality of circuit boards.

2. The method according to claim 1, wherein said providing step comprises the step of providing a plurality of surface mount circuit boards.

3. The method according to claim 1, wherein said providing step further comprises the step of:
   mounting one or more electronic components to one of said plurality of circuit boards.

4. The method according to claim 1, wherein said attaching step (c) comprises:
   providing a storage unit having a plurality of said electromagnetic shields;
   removing an electromagnetic shield from the storage unit;
   placing said electromagnetic shield on said preselected grounding site; and
   attaching said shield to said grounding site.

5. The method according to claim 4, wherein said removing step comprises the step of removing said electromagnetic shield from said storage unit with an automated assembly unit, and wherein said placing step comprises the step of placing said electromagnetic shield on said preselected grounding site with said automated assembly unit.

6. The method according to claim 5, wherein said providing step comprises conveying said plurality of circuit boards to a position adjacent said automated assembly unit.

7. The method according to claim 1, wherein step (c) precedes step (b).

8. The method according to claim 4, wherein said shield-providing step comprises providing said plurality of electromagnetic shields on a tape reel, said shields being serially and releasably attached thereto, and wherein said removing step comprises the step of peeling one of said plurality of shields from said tape reel.

9. The method according to claim 8, further comprising the steps of:
   testing a second plurality of circuit boards for electromagnetic interference; and
   reprogramming said automatic assembly unit control module to designate a different one of said plurality of grounding site.

10. A method of manufacturing a plurality of electronic packages comprising the steps of:
    (a) providing a first circuit board having a plurality of electronic devices and a plurality of grounding sites;
    (b) testing said first circuit board for electromagnetic interference;
    (c) selecting at least one of said plurality of grounding sites for which attachment of a shielding unit reduces electromagnetic interference on said first circuit board;
    (d) providing a plurality of second circuit boards, each of which has said plurality of electronic devices and said plurality of grounding sites; and
    (e) attaching shielding units to the selected ones of said plurality of grounding sites on said plurality of second circuit boards.

11. The method according to claim 10, wherein said step of providing a plurality of second circuit boards comprises the step of providing a plurality of surface mount circuit boards.

12. The method according to claim 10, wherein said attaching step comprises:
    providing a storage unit having a plurality of shielding units;
    removing a shielding unit from the storage unit;
    placing said shielding unit on said preselected grounding site; and
    attaching said shielding unit to said grounding site.

13. The method according to claim 12, wherein said removing step comprises the step of removing said shielding unit from said storage unit with an automated placement unit, and wherein said placing step comprises the step of placing said shielding unit on said preselected grounding site with said automated assembly unit.

14. The method according to claim 13, wherein said step of providing a plurality of second circuit boards comprises conveying said plurality of circuit boards to a position adjacent said automated placement unit.

15. The method according to claim 13, wherein said automated assembly unit further comprises a control module for designating said preselected grounding site.

16. The method according to claim 12, wherein said shielding unit providing step comprises providing said plurality of shielding units on a tape reel, said shielding unit being serially and releasably attached thereto, and wherein said removing step comprises the step of peeling one of said plurality of shielding units from said tape reel.

17. The method according to claim 15, wherein said selecting step comprises programming said control module to designate one of said plurality of grounding sites to receive a shielding unit so that the electromagnetic interference experienced by said sensitive device is reduced.

18. A method of manufacturing a plurality of electronic packages comprising the steps of:

(a) providing a plurality of first tape reels, each of which has a plurality of electronic components serially and releasably attached thereto;

(b) providing a second tape reel having a plurality of electromagnetic shielding units serially and releasably attached thereto;

(c) providing a plurality of circuit boards, each of which has a plurality of grounding sites;

(d) automatically picking selected ones of said electronic components from said first tape reels;

(e) automatically placing said selected electronic components on one of said plurality of circuit boards;

(f) automatically picking at least one of said plurality of shielding units from said second tape reel;

(g) automatically placing said at least one shielding unit at preselected ones of said plurality of grounding sites to reduce electromagnetic interference experienced by said electronic components on said circuit board; and (h) repeating steps (d)–(g) for second and subsequent ones of said plurality of circuit boards.

19. The method according to claim 18, wherein step (g) is preceded by the step of:

preselecting which of said plurality of grounding sites reduces the electromagnetic interference experienced by said electronic components on said circuit board when a shielding unit is attached thereto.

20. The method according to claim 18, wherein step (g) is preceded by the step of:

programming an automatic placement unit to place a shielding unit at each of preselected ones of said plurality of grounding sites to reduce electromagnetic interference experienced by said electronic components on said circuit board.

21. The method according to claim 18, wherein said providing step comprises the step of providing a plurality of surface mount circuit boards.

22. The method according to claim 18, wherein said steps (f) and (g) precede steps (d) and (e).

23. The method according to claim 18, wherein said circuit board providing step comprises conveying said plurality of circuit boards to a position adjacent said automated assembly unit.

24. The method according to claim 18, further comprising the steps of:

testing a second plurality of circuit boards for electromagnetic interference; and preselecting which of said plurality of grounding sites reduces the electromagnetic interference experienced by said electronic components on each of said circuit boards of said second plurality of circuit boards when a shielding unit is attached thereto.

* * * * *